United States Patent
Schrödinger

(10) Patent No.: US 6,901,091 B2
(45) Date of Patent: May 31, 2005

(54) ELECTRONIC DRIVER CIRCUIT FOR DIRECTLY MODULATED SEMICONDUCTOR LASERS

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 10/330,934

(22) Filed: Dec. 27, 2002

(65) Prior Publication Data
US 2004/0081212 A1 Apr. 29, 2004

(30) Foreign Application Priority Data
Oct. 28, 2002 (DE) .................... 102 50 986

(51) Int. Cl.⁷ ............................... H01S 3/10
(52) U.S. Cl. .............. 372/26; 379/29.01; 379/30; 379/38.1; 379/38.02; 379/38.07
(58) Field of Search ............... 372/26, 29.011, 372/29.012, 30, 31, 33, 38.1, 38.02, 38.07, 38.08, 43, 29.1

(56) References Cited

U.S. PATENT DOCUMENTS

| | | |
|---|---|---|
| 4,032,802 A | 6/1977 | Pan et al. |
| 4,799,224 A * | 1/1989 | Bottacchi et al. ......... 372/38.02 |
| 4,952,820 A | 8/1990 | Frisch |
| 6,532,245 B1 * | 3/2003 | Paschal et al. ........... 372/38.02 |
| 2002/0085599 A1 | 7/2002 | Schrodinger |

FOREIGN PATENT DOCUMENTS

| | | |
|---|---|---|
| DE | 100 65 838 A1 | 7/2002 |
| JP | 11 122 189 A | 4/1999 |
| JP | 2002 111 118 A | 4/2002 |

* cited by examiner

Primary Examiner—Minsun Oh Harvey
Assistant Examiner—Armando Rodriguez
(74) Attorney, Agent, or Firm—Laurence A. Greenberg; Werner H. Stemer; Ralph E. Locher

(57) ABSTRACT

An electronic driver circuit for a directly modulated semiconductor laser has a first circuit for generating a constant current and second circuit for modulating the constant current in dependence on a digital data signal. The modulated current forms a laser current that drives the semiconductor laser. An optimal signal shape of the modulated current is guaranteed to the greatest possible extent, even in the case of high modulation frequencies above one Gbit/s, by way of a third circuit that is connected in parallel with the semiconductor laser. The third circuit acts as an ohmic resistance with a high impedance for direct current and with a low-impedance for alternating current with the modulation frequency.

24 Claims, 5 Drawing Sheets

ELECTRONIC DRIVER CIRCUIT FOR DIRECTLY MODULATED SEMICONDUCTOR LASERS

BACKGROUND OF THE INVENTION

Field of the Invention

The invention relates to an electronic driver circuit for directly modulated semiconductor lasers. A first circuit generates a constant current, a second circuit modulates the constant current in dependence on a digital data signal, and the modulated current is fed to a semiconductor laser.

One exemplary field of application of the invention is its use in driving laser diodes for generating light in optical data transmission systems. The optical output power of a laser diode is defined by the driver circuit that feeds to the laser diode a biasing current that is modulated as a function of the data signal which is to be transmitted.

Such circuits, unless further improved, have the disadvantage that the speed is limited by a high output resistance of the circuit, and by a usually relatively high-impedance laser internal resistance (in particular when vertical cavity surface emitting lasers (VCSELs) are used). This is disadvantageous in particular at high bit rates in the gigahertz range.

SUMMARY OF THE INVENTION

I have previously disclosed an electronic driver circuit for directly modulated semiconductor lasers in my copending patent application Ser. No. 09/790,027, published as US 2002/0085599 A1 and corresponding to German patent application DE 100 65 838 A1. That electronic driver circuit comprises a current mirror circuit which is formed by two transistors as a first circuit for generating a constant current. A difference amplifier consisting of two transistors and a current source is provided in my earlier electronic driver circuit as a second circuit for modulating the constant current. Besides these, my earlier electronic driver circuit is provided with circuit measures that emit an additional positive or negative current pulse (or impulse) for the semiconductor laser when the current through the semiconductor laser rises or falls, respectively. These additional current pulses compensate for parasitic elements such as inductances and/or capacitances, and improve the optical signal shape of the modulated current in the semiconductor laser.

The object of the invention disclosed herein is to provide an electronic driver circuit for directly modulated semiconductor lasers which is yet further improved and to a large extent guarantees an optimal signal shape of the modulated current of the semiconductor laser even at high modulation frequencies above one Gbit/s.

With the above and other objects in view there is provided, in accordance with the invention, an electronic driver circuit for directly modulated semiconductor lasers, comprising:

a first circuit for generating a constant current;

a second circuit for modulating the constant current in dependence on a digital data signal to generate a modulated current to be fed to a semiconductor laser; and a third circuit, connected in parallel with the semiconductor laser, said third circuit acting as an ohmic resistance with a high impedance for direct current and a low impedance for alternating current, in particular for alternating current with a modulation frequency with which the laser current is modulated.

In other words, the electronic driver circuit according to the invention comprises are third circuit part, which are conductively connected in parallel with the semiconductor laser and which act as an ohmic resistance (i.e. an effective resistance), whereby the ohmic resistance is high-impedance for direct current and it is low-impedance for alternating current, particularly for alternating current with the modulation frequency.

A substantial advantage of the electronic driver circuit is that a bandwidth limitation of the electronic driver circuit in connection with the parasitic capacitance of the semiconductor laser is reduced or avoided, as the case may be, whereby a substantially optimal signal shape of the modulated current in the semiconductor laser, and therefore a substantially optimal signal shape of the optical pulses of the semiconductor laser, are guaranteed.

The circumstances of that will now be briefly explained: In conventional semiconductor lasers, the parasitic capacitance $C_{par}$ typically has a value of approx. 1 pF. For alternating currents, the differential ohmic resistance rd of the semiconductor laser is parallel to the parasitic capacitance $C_{par}$. The differential resistance rd equals approx. 50 Ω to 100 Ω. A time constant $\tau=C_{par}$ rd on the order of approx. 100 ps can be computed from the differential resistance rd and the parasitic capacitance $C_{par}$. For a time constant of approx. 100 ps, the limit frequency of the electronic driver circuit is approx. 1.7 GHz. In order to raise this limit frequency, the invention provides for the connecting of an additional resistance parallel to the parasitic capacitance $C_{par}$, which reduces the time constant τ. The reduction of the time constant τ brings about an increase in the limit frequency of the driver circuit, whereby the desired optimal signal shape of the modulated current in the semiconductor laser, and with that the desired optimal signal shape of the optical laser pulses, are achieved.

Another substantial advantage of the electronic driver circuit according to the invention is that, in contrast with older electronic drive circuits, extra direct current need not be generated by the driver circuit. Namely, in the novel electronic driver circuit, the flow of an additional direct current is effectively prevented by the third circuit, which generates a high ohmic resistance for a direct current. Only for the alternating-current portion that is generated based on the modulation of the current does the third circuit form a low ohmic resistance. Direct current is blocked by the third circuit.

Switching in—that is, shunting—an ohmic resistance which is low-impedance for alternating current does reduce the overall resistance parallel to the parasitic capacitance $C_{par}$, causing the time constant τ to drop and the limit frequency to rise; however, current through the semiconductor laser is also "lost" owing to the reduced parallel resistance, specifically because the modulated current that is generated by the driver circuit now flows through the additional ohmic resistance as well. Less current therefore flows through the semiconductor laser overall, and therefore the optical "swing" in the optical output power of the semiconductor laser is reduced. It is therefore seen as advantageous when, according to a development of the inventive electronic driver circuit, the third circuit are dimensioned, with respect to the size of the ohmic resistance for alternating current, in such a way that a predetermined swing in the optical output power of the semiconductor laser is guaranteed.

The third circuit can be constructed particularly simply and expediently when it includes a resistance device with a blocking device connected to it, whereby the resistance device defines the level of the ohmic resistance of the third circuit, and whereby the blocking device is high-impedance for direct current and low-impedance for alternating current of the modulation frequency. Dividing the third circuit into a resistance device and a blocking device makes it possible to optimize each of the two components individually.

The resistance device can be advantageously formed by a transistor, which is driven such that it generates an ohmic resistance of a defined magnitude. The transistor can advantageously be a field effect transistor which is driven by way of its gate terminal and which generates the ohmic resistance of predetermined magnitude between its source and drain terminals.

Instead, the resistance device can also be a simple ohmic resistor. In order to make it possible to individually set the resistance level, it is expedient when the resistance device contains at least two parallel ohmic resistances, each of which can be separately switched in and out, and which together generate the resistance at a predetermined level.

The prescribed magnitude of the resistance should be selected to achieve both the optical signal swing of the semiconductor laser and the wanted electrical limit frequency of the driver circuit.

In order to effectuate the switching of the parallel ohmic resistances in and out, the ohmic resistances can be connected in series with respective switch elements, said switching elements of the resistance device being driven by a control device in such a way that the resistance device, i.e. the parallel ohmic resistances as a whole, generates the resistance of prescribed magnitude.

The resistance device and the blocking device can be advantageously interconnected such that the resistance device is connected to a terminal of the semiconductor laser with one terminal and to the blocking device with the other terminal.

The blocking device can be easily and advantageously formed by an amplifier circuit which is connected on the output side to the additional terminal of the resistance device.

The amplifier circuit can be advantageously formed by an operational amplifier which is connected on the output side and with its inverting ("minus") input to the additional terminal of the resistance device. The non-inverting ("plus") input of the operational amplifier is advantageously connected to a low-pass filter whose limit frequency is smaller than the modulation frequency of the electronic driver circuit.

The low-pass filter at the "plus" input can be formed by a capacitor and a resistance, whereby the operational amplifier is connected across the capacitor to the additional terminal of the semiconductor laser across the resistance to the first terminal of the resistance device.

In addition, the inventive driver circuit can also be combined with a "peaking" device as described in the above cited German disclosure document. It is therefore advantageous when the driver circuit contains fourth circuit means which release an extra current flow for the semiconductor laser when the current through the semiconductor laser drops and/or rises.

Such a "peaking" device can be formed particularly advantageously and simply when the fourth circuit means comprise a transistor whose emitter terminal is connected to the semiconductor laser across a resistance, and whose base current is determined by a base-emitter control voltage that exhibits peaks during the leading edge of the current through the semiconductor laser.

In order to generate positive and negative voltage peaks, it is advantageous when the fourth circuit means comprise a transistor whose emitter terminal is connected to the semiconductor laser across a resistance and whose base current is determined by a base-emitter control voltage that exhibits positive and negative peaks according to the leading and trailing edges of the current through the semiconductor laser, whereby a constant current is generated at the transistor by means of a current mirror and modulated in correspondence with the base-emitter control voltage.

The inventive third circuit can be combined with the fourth circuit in such a way that the fourth circuit parts are interposed between the blocking device and the resistance device, with an adder being interposed between the fourth circuit means and the blocking device.

The anode of the semiconductor laser can form one terminal of the semiconductor laser, and the cathode of the semiconductor laser can form the other terminal. Furthermore, the cathode of the semiconductor laser can also connect to ground.

The third circuit can also be advantageously formed by resistances or resistors exclusively, for instance one or two resistances, namely if the first and second circuit have a corresponding internal construction, i.e. a symmetrical one; it is therefore advantageous when the first and second circuit are symmetrically constructed, with a dummy laser being driven inversely to the semiconductor laser, and with at least one ohmic resistance—particularly a series circuit consisting of two ohmic resistances with the same or substantially the same resistance values—being interposed between the two anodes or the two cathodes of the two lasers.

The functioning of this advantageous development of the inventive driver circuit will now be described in connection with the example of a series circuit with two ohmic resistances: By virtue of the symmetrical construction of the circuit, the laser anodes (or cathodes) are always at the same potential averaged over time (d.c. voltage). A virtual ground for alternating current is thus formed between the two resistances. With alternating current, each of the two resistances is parallel to a parasitic capacitance of a semiconductor laser, one resistance being parallel to the parasitic capacitance of the semiconductor laser (useful laser), and the other being parallel to the parasitic capacitance of the dummy laser. Direct current does not flow across the two resistances, because the laser anodes are always at the same potential averaged over time (d.c. voltage), as described above.

In order to reduce or prevent reflections of the laser current at the semiconductor laser, it is advantageous when the third circuit act as an ohmic resistance for alternating current, particularly for alternating current with the modulation frequency, which resistance is matched with the wave resistance of the wave conducting mechanism driving the semiconductor laser.

Other features which ate considered as characteristic for the invention are set forth in the appended claims.

Although the invention is illustrated and described herein as embodied in a electronic driver circuit for directly modulated semiconductor lasers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
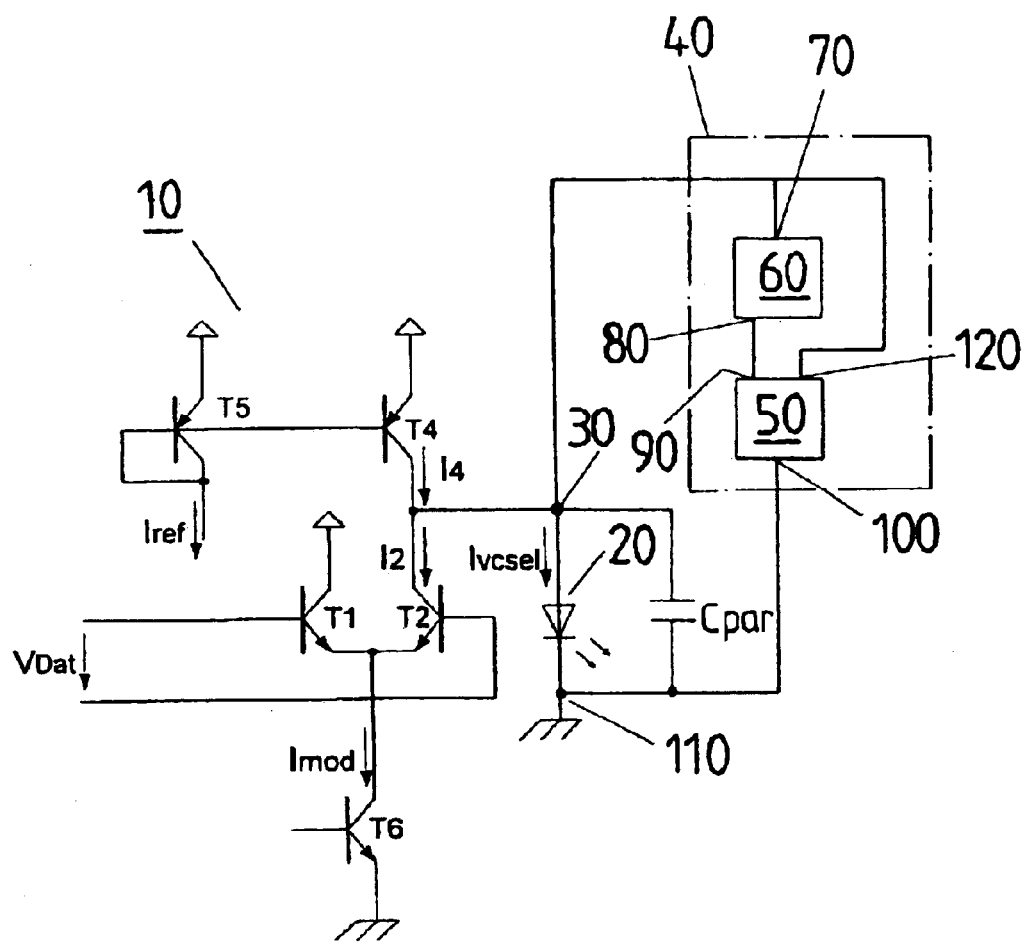
FIG. 1 is a circuit diagram of a first exemplary embodiment of the electronic driver circuit according to the invention.

Referring now to the figures of the drawing in detail and first, particularly, to FIG. 1 thereof, there is shown a first exemplary embodiment of an inventive driver circuit 10 for the direct modulation of a semiconductor laser or laser diode 20. Two transistors T4, T5 are provided for generating a constant current (pre-current) I4. The transistor T5 represents a current mirror relative to transistor T4; i.e., the two transistors T4 and T5 and the appertaining currents are identical. A reference current Iref that flows through the transistor T5 is thereby impressed on the transistor T4 as constant current I4. The constant current I4 flows into the laser diode 20 when a transistor T2 is closed, i.e., when it conducts. The current flowing through the laser diode 20 is then equal to I4 ($I_{VCSEL}$=I4)

A differential amplifier is also provided. The differential amplifier includes two transistors T1,T2 whose emitter terminals are connected to a current source T6. An input voltage VDat at the base terminals of the transistors T1,T2 represents the digital data signal that is to be transmitted. As long as a logic signal is pending, a current I2 flows through the transistor T2, and the current flowing through the laser diode 20 is reduced by this current I2 ($I_{VCSEL}$=I4–I2).

The current through the laser diode 20 and thus the optical output power of the laser diode 20 are thereby modulated in correspondence with the signal VDat. The current I2 is typically smaller than the current I4, because the threshold current of the laser 20 should flow continuously. The current Imod, which corresponds to the current I2, flows through the transistor T6.

The laser diode 20 is preferably a surface emitting VCSEL (Vertical Cavity Surface Emitting Laser) diode, which usually has a relatively high internal resistance of between 50 and 100 ohms.

A third circuit 40 is connected to a terminal 30 of the laser diode 20, namely to its anode terminal. This third circuit 40 comprises a blocking device 50 and a resistance device 60. One terminal 70 of the resistance device 60 is connected to the anode 30 of the laser diode 20. Another terminal 80 of the resistance device 60 is connected to a terminal 90 of the blocking device 50. Another terminal 100 of the blocking device 50 is connected to the cathode 110, that is to say the second terminal, of the laser diode 20.

The anode 30 of the laser diode 20 is connected to a third terminal 120 of the blocking device 50 on line side.

The device according to FIG. 1 functions as follows:

The third circuit portion, referred to as a third circuit 40, is parallel to the laser diode 20 and forms an ohmic resistance parallel to the laser diode 20. This ohmic resistance is dependent on the frequency of the current flowing through the laser diode 20. The third circuit 40 is very high-impedance for a direct current but also for a low-frequency alternating current, whereas the third circuit 40 is low-impedance for a higher-frequency alternating current, particularly an alternating current with the modulation frequency of the laser diode 20.

In order to achieve this functionality of the third circuit 40, the resistance device 60 is constructed to be low-impedance. The resistance device 60 can consist of a controlled transistor, particularly a field effect transistor, but also of ohmic resistances. The resistance device 60 is thus frequency-independent and represents a low-impedance resistance for currents with any frequency.

The blocking device 50 is constructed such that it approximately represents a short circuit in relation to the terminal or node 90 for higher-frequency alternating currents, particularly alternating currents with the modulation frequency of the laser diode 20. But for direct currents and very low-frequency alternating currents, the blocking device is very high-impedance and thus blocks practically all current flow with a low frequency.

Based on this electrical behavior of the third circuit 40, a low resistance $R_{parallel}$ is connected parallel to the parasitic capacitance $C_{par}$ of the laser diode 20. On the basis of this resistance $R_{parallel}$ of the third circuit 40, the following time constant τ emerges:

$$\tau = (R_{parallel} \| r_d) * C_{par}$$

$$\tau = (R_{parallel} * r_d)/(R_{parallel} + r_d) * C_{par}$$

where $r_d$ is the differential resistance of the laser diode 20; $C_{par}$ is the parasitic capacitance of the laser diode 20; and $R_{parallel}$ is the ohmic resistance of the third circuit 40 for higher-frequency alternating currents. The parasitic capacitance $C_{par}$ should therefore take into account the overall capacitance at the node 30 (i.e. the anode 30), meaning both the "internal" VCSEL capacitance of the laser diode 20 and the external capacitances such as other pad capacitances in the IC or PCB which connect to the anode 30 of the laser diode 20.

The limit frequency fg of the electronic driver circuit 10 is calculated as follows:

$$fg = \frac{1}{2\pi} * 1/\tau = (R_{parallel} + r_d)/[2\pi * R_{parallel} * r_d * C_{par}]$$

The size of the resistance $R_{parallel}$ thus determines the limit frequency fg of the electronic driver circuit 10 according to FIG. 1. The smaller the resistance $R_{parallel}$ is, the larger the limit frequency fg is; but it should be noted that a particularly small resistance $R_{parallel}$ also gives rise to a particularly large current through the resistance. Thus, given a small resistance $R_{parallel}$, the current $I_{VCSEL}$ through the laser diode 20 drops, whereby the optical signal swing of the laser diode 20 also falls.

Therefore, the optimization must take into account which optical signal swing must be generated by the laser diode in order to guarantee the desired optical data transmission. The corresponding dimensioning of the resistance $R_{parallel}$, and with that the limit frequency fg of the electronic driver circuit 10, are then defined according to the required signal swing.

Figure 2:
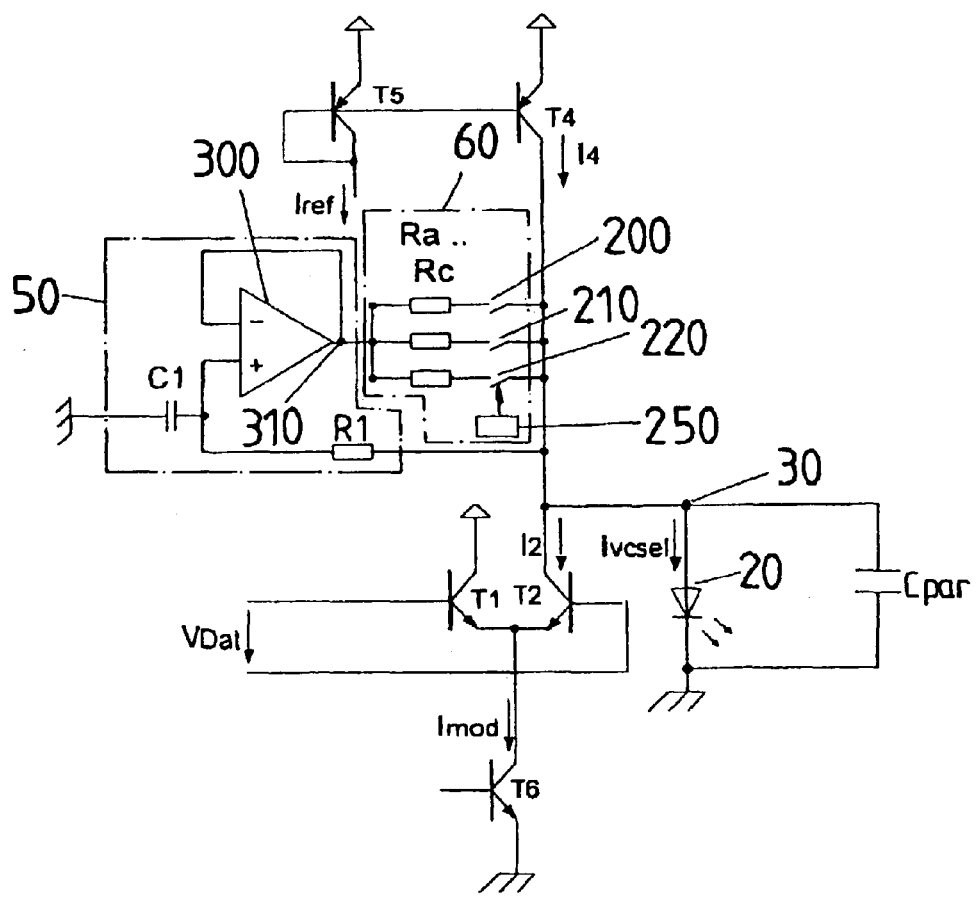
FIG. 2 is a schematic circuit diagram of the exemplary embodiment of FIG. 1 in greater detail.

FIG. 2 represents in detail how the third circuit 40 according to FIG. 1 can be constructed.

The resistance device 60 consists of three parallel resistances $R_a$, $R_b$, $R_c$. A switch element 200, 210 and 220 is connected in series with each of the three resistances $R_a$, $R_b$, $R_c$. Each of the three switch elements 200, 210, and 220 is driven by a control device 250.

By means of the control device 250, the resistance value $R_{parallel}$ that is to be formed by the resistance device 60 can be set.

The blocking device 50 is formed by an operational amplifier 300 whose inverting ("minus") input is connected to the output 310 of the operational amplifier 300. The output 310 of the operational amplifier 300 simultaneously forms one terminal 90 of the blocking device 50 according to FIG. 1.

FIG. 2 further reveals that the non-inverting ("plus") input of the operational amplifier 300 is connected to a terminal of a capacitor C1 and to a terminal of a resistance R1.

The other terminal of the capacitor C1 is connected to ground; the other terminal of the resistance R1 is connected to the anode 30 of the laser diode 20.

The circuit according to FIG. 2 functions as follows: The resistance $R_{parallel}$ that is to be formed by the resistance device 60 is set with the aid of the control device 250; this is achieved specifically by the switches 200, 210 and 220 being switched on and off accordingly.

When all three switch elements 200, 210 and 220 are on, the resistance device 60 exhibits its lowest resistance $R_{parallel}=(Ra\|Rb\|Rc)$; the resistance value $R_{parallel}$ of the resistance device 60 can then be correspondingly raised by opening the switching elements 200, 210 or 220.

The selection of the resistance $R_{parallel}$ of the resistance device 60 determines the limit frequency that can be achieved by the driver circuit 10 and the optical swing that can be achieved by the laser diode 20.

Because of its wiring, the operational amplifier 300 operates such that it always generates exactly the same d.c. potential at its output 310, namely precisely the same potential as the potential at the anode 30 of the laser diode 20. For direct current, the same potential is thus present at the two terminals 70 and 80 of the resistance device, and therefore direct current cannot flow through the resistance device 60. The third circuit 40, which consist of the resistance device 60 and the blocking device 50, are thus very high-impedance for direct current, because current flow through the blocking device 50 is almost impossible. The same is true of very low-frequency alternating currents owing to the low-pass filter formed by the resistance R1 and the capacitance C1. The low-pass filter has a limit frequency corresponding to the following:

$$fg(\text{low-pass filter})=\tfrac{1}{2}\pi*1/(R1*C1)$$

Alternating currents with a frequency below the limit frequency of the low-pass filter are treated like direct currents; accordingly, such alternating currents cannot flow across the blocking device 50, because they are "regulated out" by the operational amplifier 300.

This "regulating out" does not work given very high alternating currents, because of the absence of a correspondingly large feedback voltage at the "plus" input of the operational amplifier. Higher-frequency alternating currents with a frequency above the limit frequency of the low-pass filter formed by the resistance R1 and the capacitance C1 thus flow across the resistance device 60 into the output 310 of the operational amplifier 300.

Because the small signal equivalent circuit diagram of the operational amplifier 300 comprises a very low-impedance output resistance ra on the output side, which is connected to a voltage source which emits the output voltage of the operational amplifier 300, a higher-frequency alternating current coming from the anode of the semiconductor laser 20 only "sees" a total resistance $R_{parallel}$ of the third circuit according to the following:

$$R_{total}=R_{parallel}+ra\approx R_{parallel}$$

For higher-frequency alternating currents, the resistance device 60 and the blocking device 50 thus form an ohmic resistance $R_{parallel}$ which is formed by the resistance device 60 and set by the control device 250 of the resistance device 60.

This resistance $R_{parallel}$ is parallel to the laser diode 20 and the parasitic capacitance $C_{par}$ of the laser diode, as described above, and thus raises the limit frequency fg of the driver circuit 10 according to FIGS. 1 and 2.

Figure 3:
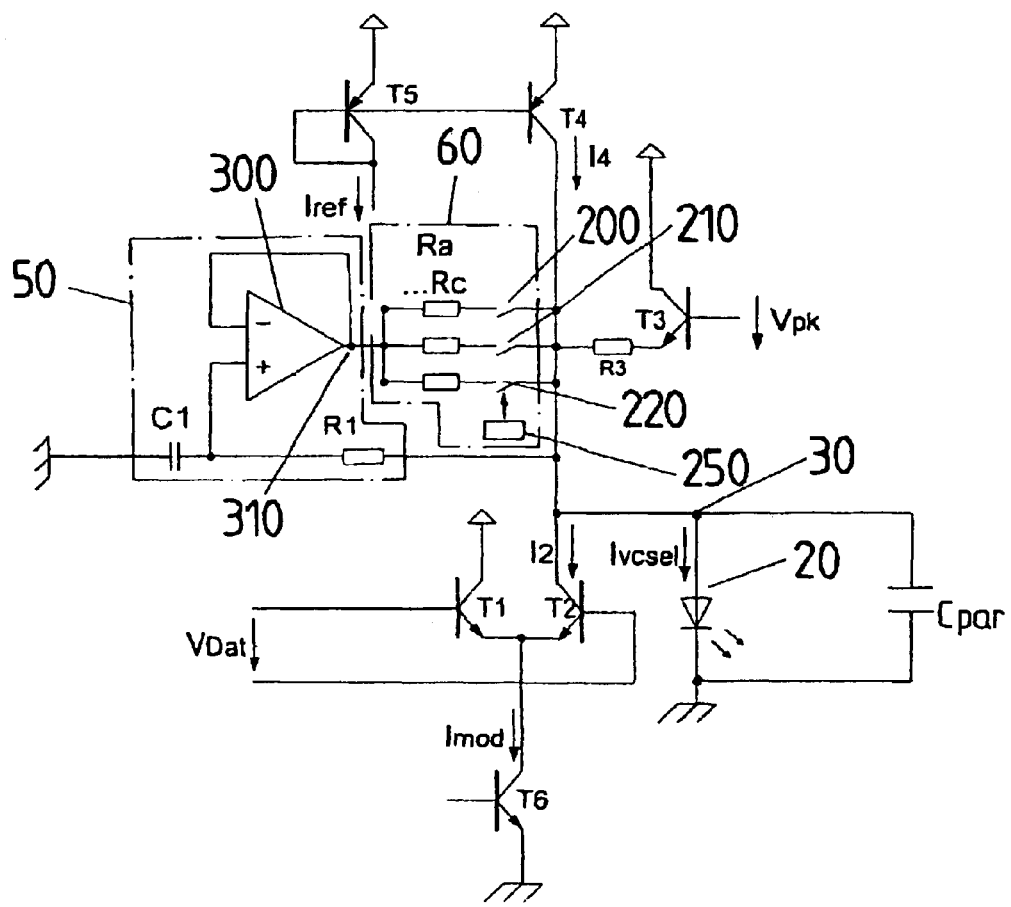
FIG. 3 is a schematic circuit diagram of a second exemplary embodiment of an electronic driver circuit according to the invention.

FIG. 3 represents a second exemplary embodiment of an inventive driver circuit. The driver circuit according to FIG. 3 corresponds to the driver circuit according to FIG. 2 in its essential parts.

Unlike the driver circuit according to FIG. 2, the second exemplary embodiment according to FIG. 3 is additionally provided with a "peaking" device consisting of a transistor T3 and a resistance R3.

If a corresponding control voltage Vpk is applied to the base of the transistor T3 during leading or trailing edges of the modulated current $I_{VCSEL}$ flowing through the laser diode 20, then an additional positive or negative current pulse is fed into the anode terminal 30 of the laser diode 20, with the aid of which the signal shape of the modulated current $I_{VCSEL}$ through the laser diode 20 can be optimized.

Regarding the exact mode of functioning of the peaking device formed by the transistor T3 and the resistance R3, refer to the above cited German disclosure document, which describes such peaking devices in detail.

Figure 4:
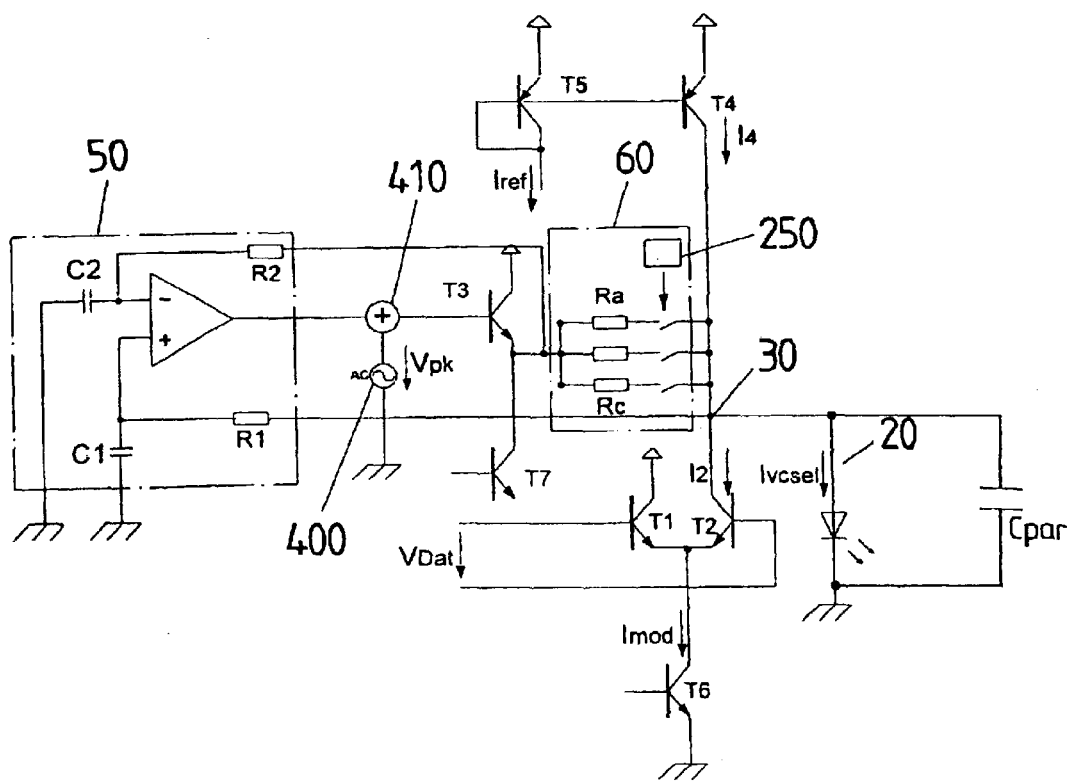
FIG. 4 is a schematic circuit diagram of a third exemplary embodiment of an electronic driver circuit according to the invention.

FIG. 4 represents a third exemplary embodiment of an inventive driver circuit. In this third exemplary embodiment, the peaking device described in connection with FIG. 2 is combined with a resistance device and a blocking device.

The peaking device is formed by the two transistors T3 and T7 and the voltage source 400. On the output side, the voltage source 400 generates the peaking voltage Vpk, which is conducted to the base terminal of the transistor T3 by way of an adder 410. Positive and negative current pulses thus emerge at the emitter terminal of the transistor T3 as soon as corresponding voltage pulses are generated by the peaking voltage source 400. These additional positive or negative current pulses are fed into the anode 30 of the laser diode 20 across the resistance device 60.

The adder 410 is also connected to the operational amplifier 300 which forms the blocking device 50. Regarding the mode of functioning of the blocking device 50 and the operational amplifier 300, refer to the above description in connection with FIGS. 1 and 2, the basic functioning of the operational amplifier 300 according to FIG. 4 being equivalent to the functioning in the exemplary embodiment according to FIG. 2, said functioning of operational amplifier 300 consisting in the representation, more or less, of a short circuit on the output side for high-frequency alternating currents.

Figure 5:
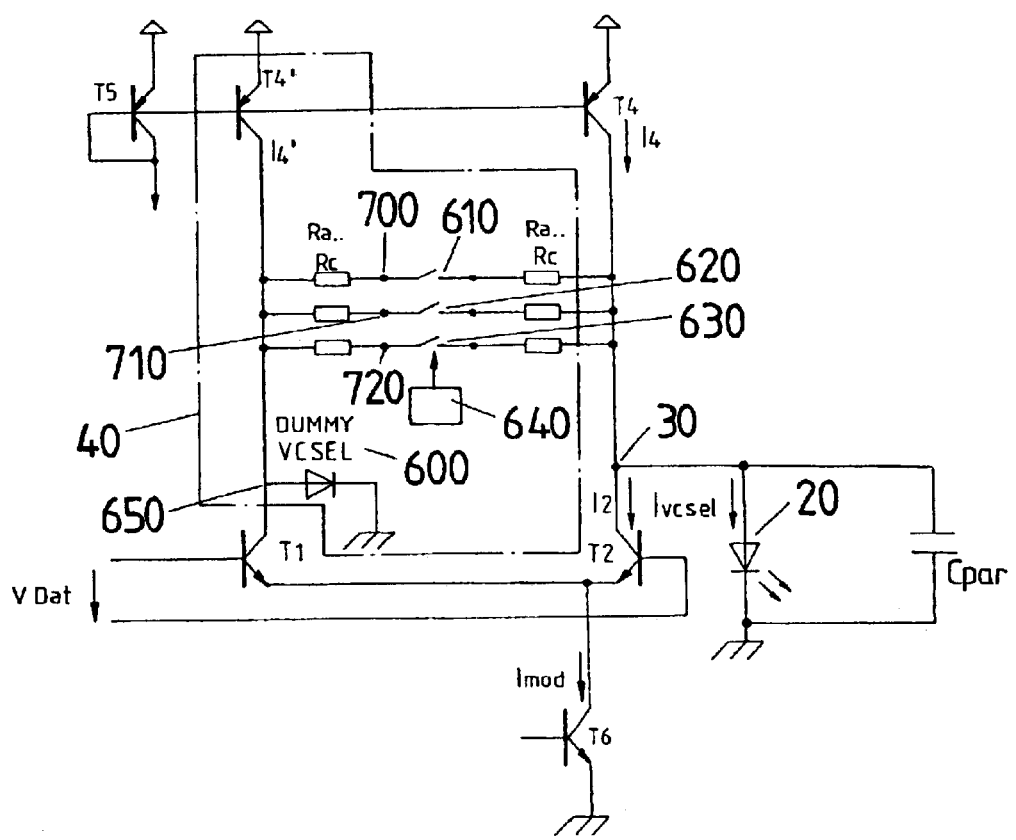
FIG. 5 is a schematic circuit diagram of a fourth exemplary embodiment of an electronic driver circuit according to the invention.

FIG. 5 represents a fourth example of an inventive driver circuit. In this fourth exemplary embodiment, the third circuit 40 are formed by an additional current mirror transistor T4', a dummy VCSEL 600 and resistances $R_a$, $R_b$, and $R_c$, which can be switched in and out by means of respective switch elements 610, 620, 630 with the aid of a control device 640.

The driver circuit according to FIG. 5 functions as follows:

Direct Current

The same current flows through the transistors T4 and T4' owing to the current mirror circuit formed by the transistor T5; in other words I4=I4'. Because of the identical current flow, the same d.c. voltage potential, averaged over time, occurs at the anode 30 of the laser diode 20 and at the anode 650 of the dummy laser diode 600, and therefore no direct current can flow through the resistances $R_a$, $R_b$, and $R_c$.

Alternating Current

For alternating current, the situation looks different, because the potentials at the anodes 30 and 650 of the two laser diodes 20 and 600 are not identical. Because the two transistors T1 and T2 are driven in opposition to one another, different a.c. voltage potentials occur at the anodes of the two laser diodes. But there is always a constant potential among the resistances $R_a$, $R_b$, and $R_c$ at points 700, 710, and 720 by virtue of the symmetry of the driver circuit according to FIG. 5; of course this applies only to those resistances $R_a$, $R_b$, $R_c$ for which the switch elements 610, 620 and 630 are closed.

The presence of a constant voltage at the connection points 700, 710 and 720 for a.c. voltage can be interpreted as a short circuit. In other words, for an a.c. voltage at the anode 30 or the anode 600, the resistances $R_a$, $R_b$, $R_c$ are respectively grounded given a closed switch element 610, 620 or 630, whereby the desired low-impedance resistance $R_{parallel}$ parallel to the parasitic capacitance $C_{par}$ of the laser diode 20 is formed.

For additional information, reference is had to my above-mentioned copending patent application Ser. No. 09/790,027, published as US 2002/0085599 A1, which is herewith incorporated by reference.

I claim:

1. An electronic driver circuit for a directly modulated semiconductor laser, comprising:
   a first circuit for generating a constant current;
   a second circuit for modulating the constant current in dependence on a digital data signal to generate a modulated current to be fed to a semiconductor laser;
   a third circuit connected to said first and second circuits and connected in parallel with the semiconductor laser, said third circuit acting as an ohmic resistance with a high impedance for direct current and, simultaneously, a low impedance for alternating current.

2. The driver circuit according to claim 1, wherein said third circuit has a particularly low impedance with alternating current with a modulation frequency of said second circuit.

3. The driver circuit according to claim 1, wherein said third circuit comprises a resistance device and a blocking device connected to said resistance device, said resistance device defining a level of an ohmic resistance of said third circuit for alternating current, and said blocking device having a high impedance for direct current.

4. The driver circuit according to claim 3, wherein said resistance device comprises a transistor driven for generating an ohmic resistance of a prescribed magnitude.

5. The driver circuit according to claim 4, wherein said transistor is a field effect transistor driven by way of a gate terminal thereof and generating the ohmic resistance of a prescribed magnitude between a source terminal and a drain terminal thereof.

6. The driver circuit according to claim 3, wherein said resistance device contains at least two parallel, individually switchable ohmic resistors for jointly generating the resistance of predetermined magnitude.

7. The driver circuit according to claim 6, wherein said resistance device further comprises respective switch elements connected in series with said ohmic resistors, and wherein a control device is connected to drive said switch elements of said resistance device to generate the resistance of prescribed magnitude.

8. The driver circuit according to claim 3, wherein said resistance device has a first terminal connected to a terminal of the semiconductor laser and a second terminal connected to said blocking device.

9. The driver circuit according to claim 3, wherein said blocking device includes an amplifier circuit having an output side connected to said resistance device.

10. The driver circuit according to claim 9, wherein said blocking device includes an operational amplifier having an output and an inverting input connected to said resistance device.

11. The driver circuit according to claim 10, wherein a non-inverting input of said operational amplifier is connected to a low-pass filter having limit frequency below a modulation frequency of said second circuit.

12. The driver circuit according to claim 11, which comprises a capacitor connected between said operational amplifier and a second terminal of the semiconductor laser, and a resistor connected between said operational amplifier and said resistance device.

13. The driver circuit according to claim 1, which further comprises a fourth circuit for releasing an additional current pulse for the semiconductor laser given a rising modulated current.

14. The driver circuit according to claim 13, wherein said fourth circuit releases an additional negative current pulse for the semiconductor laser given a falling modulated current.

15. The driver circuit according to claim 13, wherein said fourth circuit comprises a transistor having an emitter terminal connected to the semiconductor laser across a resistance and having a base current defined by a base-emitter control voltage exhibiting peaks during a leading edge of a current through the semiconductor laser.

16. The driver circuit according to claim 13, wherein said fourth circuit comprises a transistor having an emitter terminal connected to the semiconductor laser across a resistance and having a base current defined by a base-emitter control voltage with positive and negative peaks corresponding to leading and trailing edges of a current through the semiconductor laser, and which further comprises a current mirror for generating a constant current at said transistor, and wherein the constant current is modulated in correspondence with the base-emitter control voltage.

17. The driver circuit according to claim 3, which further comprises a fourth circuit for releasing an additional current pulse for the semiconductor laser connected between said blocking device and said resistance device, and an adder connected between said fourth circuit and said blocking device.

18. The driver circuit according to claim 1, wherein the semiconductor laser has a first terminal receiving the modulated current, and a second terminal connected to ground.

19. The driver circuit according to claim 18, wherein the first terminal of the semiconductor laser is an anode, and the second terminal of the semiconductor laser is a cathode.

20. The driver circuit according to claim 1, which further comprises a dummy laser, and wherein said first and second circuits are symmetrically constructed for driving said dummy laser inversely to the semiconductor laser, and wherein at least one ohmic resistance is connected between respective drive terminals of the semiconductor laser and said dummy laser.

21. The driver circuit according to claim 20, wherein the drive terminals of the semiconductor laser and said dummy laser are selected from the group of anodes and cathodes of the lasers.

22. The driver circuit according to claim 20, wherein said at least one ohmic resistance is a series circuit of two resistances with substantially equal resistance values.

23. The driver circuit according to claim 1, wherein said third circuit is an ohmic resistance for alternating current, and the ohmic resistance is matched to a wave resistance of a wave guide driving the semiconductor laser.

24. The driver circuit according to claim 23, wherein said third circuit is an ohmic resistance for alternating current with a modulation frequency of said second circuit.

* * * * *